(12) United States Patent
Zhang

(10) Patent No.: US 12,113,133 B2
(45) Date of Patent: Oct. 8, 2024

(54) METAL OXIDE TRANSISTOR, DISPLAY PANEL AND DISPLAY APPARATUS

(71) Applicant: WUHAN TIANMA MICROELECTRONICS CO., LTD., Wuhan (CN)

(72) Inventor: Qinyuan Zhang, Wuhan (CN)

(73) Assignee: WUHAN TIANMA MICROELECTRONICS CO., LTD., Wuhan. (CN)

( * ) Notice: Subject to any disclaimer, the term of this patent is extended or adjusted under 35 U.S.C. 154(b) by 443 days.

(21) Appl. No.: 17/564,045

(22) Filed: Dec. 28, 2021

(65) Prior Publication Data
US 2022/0199830 A1    Jun. 23, 2022

(30) Foreign Application Priority Data

Sep. 17, 2021 (CN) .......................... 202111095278.8

(51) Int. Cl.
*H01L 29/786* (2006.01)
*H10K 59/126* (2023.01)

(52) U.S. Cl.
CPC .... *H01L 29/7869* (2013.01); *H01L 29/78618* (2013.01); *H10K 59/126* (2023.02)

(58) Field of Classification Search
CPC .......... H01L 29/78648; H01L 29/7869; H01L 29/78696; H01L 29/78618; H01L 29/78627; H01L 2029/7863
See application file for complete search history.

(56) References Cited

U.S. PATENT DOCUMENTS 9,196,746 B2 * 11/2015 Ning ................. H01L 29/78696
2009/0160741 A1 * 6/2009 Inoue .................... H01L 27/124
438/34

(Continued)

FOREIGN PATENT DOCUMENTS

CN      110190066 A      8/2019

*Primary Examiner* — Evren Seven
(74) *Attorney, Agent, or Firm* — CHRISTENSEN O'CONNOR JOHNSON KINDNESS PLLC

(57) ABSTRACT

A metal oxide transistor, display panel and display apparatus are provided. The metal oxide transistor has characteristics of low off-state leakage current and high conductivity. In an embodiment, the metal oxide transistor includes first gate electrode, an active layer, second gate electrode, and source-drain electrode. Source-drain electrode includes source electrode and drain electrode. Active layer includes active sub-layers, active sub-layer includes metal oxide and has semiconductor zone. Active sub-layers includes first active sub-layer, second active sub-layer and third active sub-layer, first active sub-layer is located between second active sub-layer and first gate electrode, and third active sub-layer is located between second active sub-layer and second gate electrode. Semiconductor zone of first active sub-layer has an oxygen ion doping concentration $C_{O\_1}$, semiconductor zone of second active sub-layer has an oxygen ion doping (Continued)

concentration $C_{O\_2}$, and semiconductor zone of third active sub-layer has an oxygen ion doping concentration $C_{O\_3}$, where $C_{O\_1} < C_{O\_2}$, and $C_{O\_3} < C_{O\_2}$.

18 Claims, 10 Drawing Sheets

(56) References Cited

U.S. PATENT DOCUMENTS

| | | | |
|---|---|---|---|
| 2010/0038641 A1* | 2/2010 | Imai | H01L 29/7869 257/E29.29 |
| 2011/0240998 A1* | 10/2011 | Morosawa | H01L 29/78618 257/E29.273 |
| 2012/0218495 A1* | 8/2012 | Oshima | H01L 29/7869 349/61 |
| 2013/0309808 A1* | 11/2013 | Zhang | H01L 29/78648 438/104 |
| 2013/0320317 A1* | 12/2013 | Lee | H01L 29/78618 257/66 |
| 2013/0320334 A1* | 12/2013 | Yamazaki | H01L 29/42356 257/43 |
| 2014/0034945 A1* | 2/2014 | Tokunaga | H01L 29/78693 257/43 |
| 2014/0042434 A1* | 2/2014 | Yamazaki | H01L 29/78696 257/43 |
| 2014/0042437 A1* | 2/2014 | Yamazaki | H01L 29/78693 257/43 |
| 2014/0103337 A1* | 4/2014 | Yamazaki | H10B 41/70 257/43 |
| 2014/0175435 A1* | 6/2014 | Yamazaki | H01L 29/78696 257/43 |
| 2014/0252345 A1* | 9/2014 | Tsubuku | H01L 21/02554 257/43 |
| 2015/0008428 A1* | 1/2015 | Yamamoto | H01L 29/40114 257/43 |
| 2016/0155759 A1* | 6/2016 | Yamazaki | H01L 27/1225 257/43 |
| 2019/0123149 A1* | 4/2019 | Lee | H10K 59/1213 |
| 2019/0386083 A1* | 12/2019 | Liu | H10K 71/166 |
| 2021/0167212 A1* | 6/2021 | Koezuka | H01L 29/78603 |
| 2021/0399140 A1* | 12/2021 | Sato | H01L 29/66969 |
| 2022/0173247 A1* | 6/2022 | Hanada | H01L 29/78618 |
| 2022/0173248 A1* | 6/2022 | Hanada | H01L 29/7869 |
| 2022/0278234 A1* | 9/2022 | Lee | H01L 29/51 |
| 2022/0320340 A1* | 10/2022 | Goto | H01L 29/78621 |

* cited by examiner

METAL OXIDE TRANSISTOR, DISPLAY PANEL AND DISPLAY APPARATUS

CROSS-REFERENCE TO RELATED APPLICATIONS

The present application claims priority to Chinese Patent Application No. CN 202111095278.8, filed on Sep. 17, 2021, the content of which is incorporated herein by reference in its entirety.

TECHNICAL FIELD

The present disclosure relates to the field of display technologies, and, particularly, relates to a metal oxide transistor, a display panel, and a display apparatus.

BACKGROUND

Transistors conventionally include low-temperature polycrystalline transistors and metal oxide transistors. Compared with low-temperature polycrystalline transistors, metal oxide transistors have characteristics of lower leakage current and lower power consumption, and are widely used in various driving circuits.

However, based on the structure of existing the metal oxide transistor, it is difficult to further improve performance of an apparatus having the metal oxide transistor.

SUMMARY

In a first aspect of the present disclosure, a metal oxide transistor is provided, the metal oxide transistor comprising a first gate electrode, an active layer, a second gate electrode, and a source-drain electrode that are stacked, wherein the source-drain electrode comprises a source electrode and a drain electrode; the active layer comprises a plurality of active sub-layers, each of the plurality of active sub-layers comprises a metal oxide and has a semiconductor zone; the plurality of active sub-layers comprises a first active sub-layer, a second active sub-layer and a third active sub-layer, the first active sub-layer is located between the second active sub-layer and the first gate electrode, and the third active sub-layer is located between the second active sub-layer and the second gate electrode; and a semiconductor zone of the first active sub-layer has an oxygen ion doping concentration $CO\_1$, a semiconductor zone of the second active sub-layer has an oxygen ion doping concentration $CO\_2$, and a semiconductor zone of the third active sub-layer has an oxygen ion doping concentration $CO\_3$, where $CO\_1 < CO\_2$, and $CO\_3 < CO\_2$.

In a second aspect of the present disclosure, a display panel is provided, the display panel comprising a substrate; and a plurality of pixel circuits located at a side of the substrate, wherein each of the plurality of pixel circuits comprises a metal oxide transistor according to an embodiment of the present disclosure.

In a third aspect of the present disclosure, a display apparatus is provided, the display apparatus comprising a display panel according to an embodiment of the present disclosure.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, a person skilled in the art can obtain other drawings without any creative effort.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing specific embodiment, rather than limiting the present disclosure. The terms "a", "an", "the" and "said" in a singular form in an embodiment of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate only A, both A and B, and only B. In addition, the symbol "/" in the context generally indicates that the relation between the objects in front and at the back of "/" is an "or" relationship.

It should be understood that although the terms 'first', 'second', and 'third' can be used in the present disclosure to describe active sub-layers, these active sub-layers should not be limited to these terms. These terms are used only to distinguish the active sub-layers from each other. For example, without departing from the scope of the embodiments of the present disclosure, a first active sub-layer can also be referred to as a second active sub-layer. Similarly, the second active sub-layer can also be referred to as the first active sub-layer.

Before describing the technical solutions provided by the present disclosure, the structure and problems of metal oxide transistors in the related art are firstly described.

Figure 1:
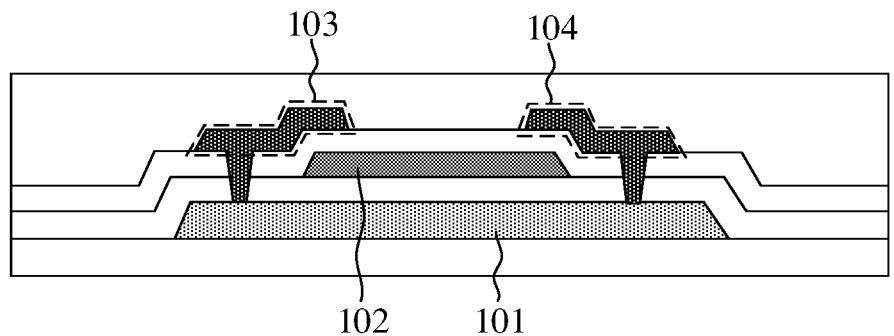
FIG. 1 is a structural schematic view showing a metal oxide transistor in the related art.

FIG. 1 is a structural schematic view showing a metal oxide transistor in the related art. As shown in FIG. 1, the metal oxide includes an active layer 101, a gate electrode 102, a source electrode 103 and a drain electrode 104. The active layer 101 is a single layer including a metal oxide.

As an intrinsic defect of metal oxide materials, oxygen vacancies are widely present in various metal oxide materials. In the related art, in order to make the metal oxide transistor have a lower off-state leakage current, the oxygen ion doping concentration of the active layer 101 is usually greatly increased, such that a large number of oxygen vacancies are occupied by oxygen ions, and then the number of oxygen vacancies is reduced in the active layer, thereby further reducing the carrier concentration of the active layer 101. However, in this way, when the metal oxide transistor is turned on, the electron mobility of the active layer 101 may be reduced correspondingly, which in turn will cause the conductivity of the transistor to decrease, affecting the conductive performance of the transistor.

Figure 2:
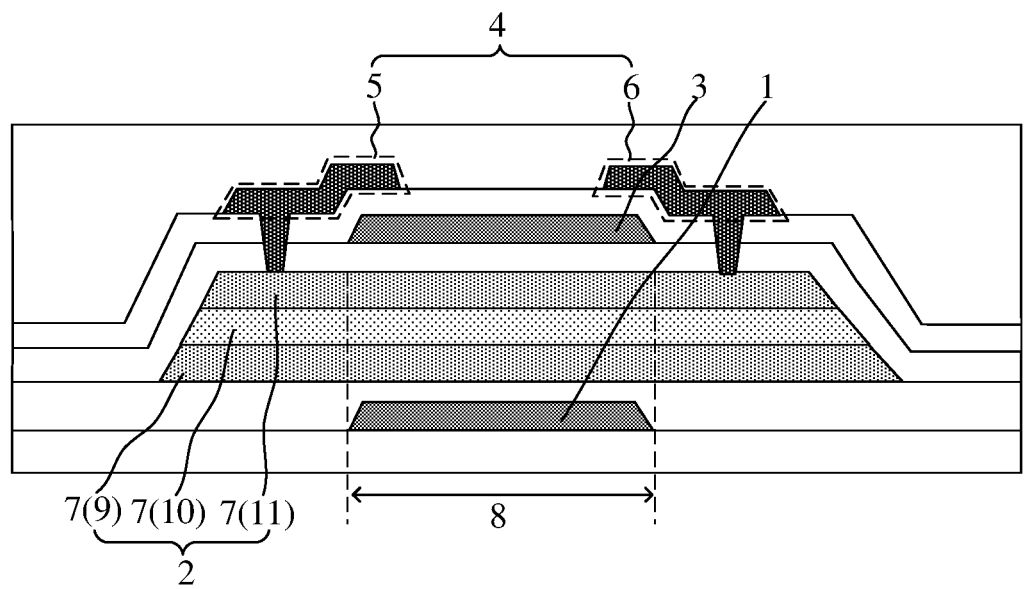
FIG. 2 is a structural schematic view showing a metal oxide transistor according to an embodiment of the present disclosure.

Based on this, the present disclosure provides a metal oxide transistor. FIG. 2 is a structural schematic view showing a metal oxide transistor according to an embodiment of the present disclosure. As shown in FIG. 2, the metal oxide transistor includes a first gate electrode 1, an active layer 2, a second gate electrode 3, and a source-drain electrode 4 that are stacked. The source-drain electrode 4 includes a source electrode 5 and a drain electrode 6. The active layer 2 includes a plurality of active sub-layers 7. The active sub-layer 7 includes a metal oxide and has a semiconductor zone 8.

The plurality of active sub-layers 7 includes a first active sub-layer 9, a second active sub-layer 10 and a third active sub-layer 11. The first active sub-layer 9 is located between the second active sub-layer 10 and the first gate electrode 1. The third active sub-layer 11 is located between the second active sub-layer 10 and the second gate electrode 3. The semiconductor zone 8 of the first active sub-layer 9 has an oxygen ion doping concentration $C_{O\_1}$, the semiconductor zone 8 of the second active sub-layer 10 has an oxygen ion doping concentration $C_{O\_2}$, and the semiconductor zone 8 of the third active sub-layer 11 has an oxygen ion doping concentration $C_{O\_3}$, where $C_{O\_1} < C_{O\_2}$, and $C_{O\_3} < C_{O\_2}$.

It should be noted that the expression "first gate electrode 1, active layer 2, second gate electrode 3, and source electrode and drain electrode 4 that are stacked" means that the active layer 2 is located at a side of the first gate electrode 1, the second gate electrode 3 is located at a side of the active layer 2 facing away from the first gate electrode 1, the source-drain electrode 4 is located at a side of the second gate electrode 3 facing away from the active layer 2, and other layers can be arranged at intervals between the first gate electrode 1 and the active layer 2, or between the active layer 2 and the second gate electrode 3, or between the second gate electrode 3 and the source-drain electrode 4. In addition, it should be noted that the source electrode 5 and the drain electrode 6 included in the source-drain electrode 4 can be electrically connected to the active layer 2 by vias, respectively. In an embodiment, the source electrode 5 and the drain electrode 6 are formed after a via is formed on an insulating layer between the source-drain electrode 4 and the active layer 2.

In an embodiment of the present disclosure, the metal oxide transistor has a top-bottom double-gate structure, and the active layer 2 has a laminated structure that includes a first active sub-layer 9, a second active sub-layer 10 and a third active sub-layer 11. When a conduction voltage for driving the transistors to turn on is applied to the first gate electrode 1 and the second gate electrode 3, since the first active sub-layer 9 is close to the first gate electrode 1, and the third active sub-layer 11 is close to the second gate electrode 3, the channels in the active layer 2 is mainly formed at a side of the semiconductor zone 8 of the first active sub-layer 9 close to the first gate electrode 1, and formed at a side of the semiconductor zone 8 of the third active sub-layer 11 close to the second gate electrode 3. Since the second active sub-layer 10 is far from the first gate electrode 1 and the second gate electrode 3, the second active sub-layer 10 has almost no channels.

Based on this, the present disclosure performs a different design on the oxygen ion doping concentrations of the first active sub-layer 9, the second active sub-layer 10 and the third active sub-layer 11, such that the oxygen ion doping concentrations of the semiconductor zones 8 of the first active sub-layer layer 9, the second active sub-layer 10, and the third active sub-layer 11 satisfy: $C_{O\_1} < C_{O\_2}$, and $C_{O\_3} < C_{O\_2}$. With such a configuration, the first active sub-layer 9 and the third active sub-layer 11 for forming channels have a low oxygen ion doping concentration, only a small amount of oxygen vacancies are occupied by oxygen ions in the two active sub-layers, i.e., the number of left oxygen vacancy is large, such that the electron mobility of the two active sub-layers can be increased while the threshold voltage and sub-threshold swing of the transistor are reduced. Therefore, a higher conductivity of the transistor can be achieved when the transistor is turned on, and the conductive performances of the transistor can be optimized. In addition, since the second active sub-layer 10 that is not configured to form a channel has a higher oxygen ion doping concentration, the number of oxygen vacancy of the active sub-layer is relatively small. When the transistor is turned off, the second active sub-layer 10 can be used to reduce an overall carrier concentration of the active layer 2, such that the metal oxide transistor has a lower off-state leakage current.

Therefore, the metal oxide transistor provided by the present disclosure has characteristics of low off-state leakage current and high conductivity, and has a larger on-off ratio, which significantly optimizes the performances of the metal oxide transistor.

In addition, the metal oxide transistor provided by the present disclosure has a top-bottom double-gate structure. Compared with a single-gate structure, the transistor can form two channels, such that the gate voltage can be used to a greater extent to attract more carriers. Moreover, when the transistor is turned on, a majority of carriers of the second active sub-layer 10 will be attracted by the gate voltage to flow into the channels of the first active sub-layer 9 and the second active sub-layer 10, thereby increasing source passages of the carriers in the channel, and further improving the conductive performances of the metal oxide transistor.

It should be noted that, in an embodiment of the present disclosure, the first active sub-layer 9, the second active sub-layer 10, and the third active sub-layer 11 may include IGZO (Indium-Gallium-Zinc Oxide), ZnO (zinc oxide), SnO (Stannous Oxide), IZO (Indium-Zinc Oxide), GaZnO (Gallium-Zinc Oxide), ZTO (Zinc-Tin Oxide), and ITO (Indium-Tin Oxide), respectively.

In an embodiment, the first active sub-layer 9, the second active sub-layer 10, and the third active sub-layer 11 each include the same metal oxide, and there is a small lattice difference among three active sub-layers, such that the interface defect between the first active sub-layer 9 and the second active sub-layer 10, and the interface defect between the second active sub-layer 10 and the third active sub-layer 11 are effectively reduced, and the influence of interface defects on the leakage current is reduced, thereby achieving a lower off-state leakage current of the transistor.

In an embodiment, the first active sub-layer 9, the second active sub-layer 10, and the third active sub-layer 11 each include an indium-gallium-zinc oxide.

At this time, the semiconductor zone 8 of the first active sub-layer 9 has an indium ion doping concentration $C_{In\_1}$, the semiconductor zone 8 of the second active sub-layer 10 has an indium ion doping concentration $C_{In\_2}$, and the semiconductor zone 8 of the third active sub-layer 11 has an indium ion doping concentration $C_{In\_3}$, where $C_{In\_1} > C_{In\_2}$, and $C_{In\_3} > C_{In\_2}$; and/or, the semiconductor zone 8 of the first active sub-layer 9 has a gallium ion doping concentration $C_{Ga\_1}$, the semiconductor zone 8 of the second active sub-layer 10 has a gallium ion doping concentration $C_{Ga\_2}$, and the semiconductor zone 8 of the third active sub-layer 11 has a gallium ion doping concentration $C_{Ga\_3}$, where $C_{Ga\_1} < C_{Ga\_2}$, and $C_{Ga\_3} < C_{Ga\_2}$.

For example, in an embodiment of the present disclosure, $C_{In\_1} > C_{In\_2}$, $C_{In\_3} > C_{In\_2}$, and, $C_{Ga\_1} < C_{Ga\_2}$, $C_{Ga\_3} < C_{Ga\_2}$; or, $C_{In\_1} > C_{In\_2}$, $C_{In\_3} > C_{In\_2}$; or, $C_{Ga\_1} < C_{Ga\_2}$, $C_{Ga\_3} < C_{Ga\_2}$.

For indium ions, their orbital radiuses are large, and the ns orbital extension between adjacent atoms is large, which contributes to improve the electron mobility. For gallium ions, there is a wide gap between the valence band and conduction band of gallium, i.e., the energy band is wide, which contributes to improving the electric insulating performance and reducing the electron mobility.

Therefore, on the premise of performing a different design for the oxygen ion doping concentration of different active sub-layers, the indium ion doping concentration and/or gallium ion doping concentration in the different active sub-layers have a different design, such that the off-state leakage of the transistor is further reduced and the conductivity of the transistor is further improved. In an embodiment, for the first active sub-layer 9 and the third active sub-layer 11 for forming the channel, when the transistor is turned on, its electron mobility can be increased to a greater extent by increasing the indium ion doping concentration and/or reducing the gallium ion doping concentration, thereby further increasing the conductivity of the transistor. For the second active sub-layer 10, when the transistor is turned off, this active sub-layer can be used to reduce the overall carrier concentration by reducing its indium ion doping concentration and/or increasing its gallium ion doping concentration, thereby further reducing the off-state leakage current of the transistor.

In an embodiment, $C_{O\_1} = C_{O\_3}$, i.e., the oxygen ion doping concentration of the semiconductor zone 8 of the first active sub-layer 9 is equal to that of the semiconductor zone 8 of the third active sub-layer 11, such that the oxygen concentration ratios required by the processes for forming the first active sub-layer 9 and the third active sub-layer 11 are the same, thereby simplifying the process of the active layer 2.

Figure 3:
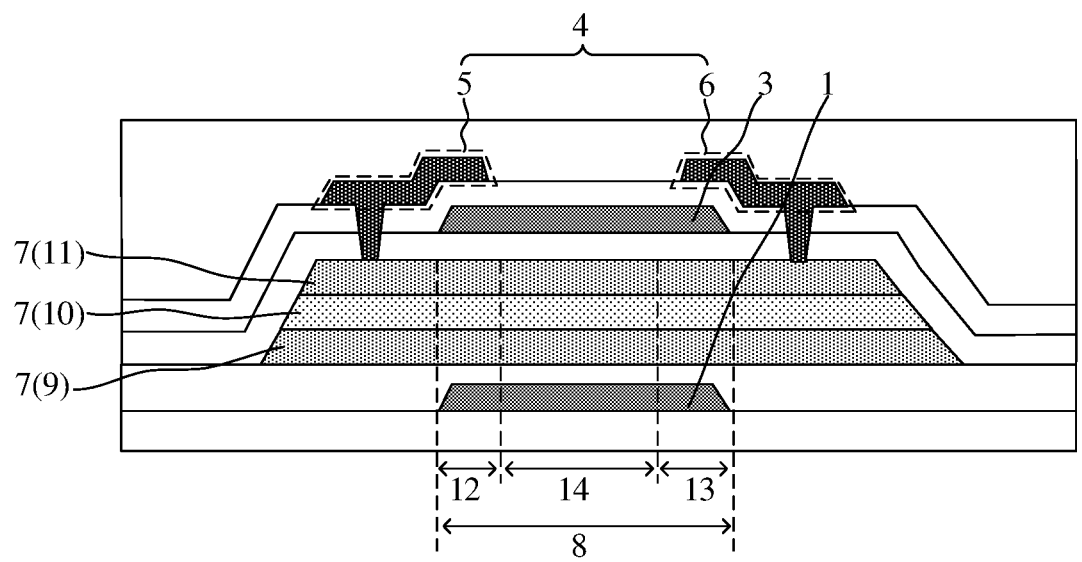
FIG. 3 is a structural schematic view showing a semiconductor zone of an active sub-layer according to an embodiment of the present disclosure.

FIG. 3 is a structural schematic view showing a semiconductor zone of an active sub-layer according to an embodiment of the present disclosure. In an embodiment, as shown in FIG. 3, the semiconductor zone 8 includes a first semiconductor zone 12, a second semiconductor zone 13, and a third semiconductor zone 14 located between the first semiconductor zone 12 and the second semiconductor zone 13. The oxygen ion doping concentration in the first semiconductor zone 12 is lower than the oxygen ion doping concentration in the third semiconductor zone 14, or the oxygen ion doping concentration of the second semiconductor zone 13 is lower than the oxygen ion doping concentration of the third semiconductor zone 14.

It should be noted that, in the present disclosure, the semiconductor zones 8 in each of the first active sub-layer 9, the second active sub-layer 10, and the third active sub-layer 11 includes the first semiconductor zone 12, the second active sub-layer 13, and the third semiconductor zone 14, the oxygen ion doping concentrations of the first semiconductor zone 12, the second active sub-layer 13, and the third semiconductor zone 14 satisfy the above relationship.

Figure 4:
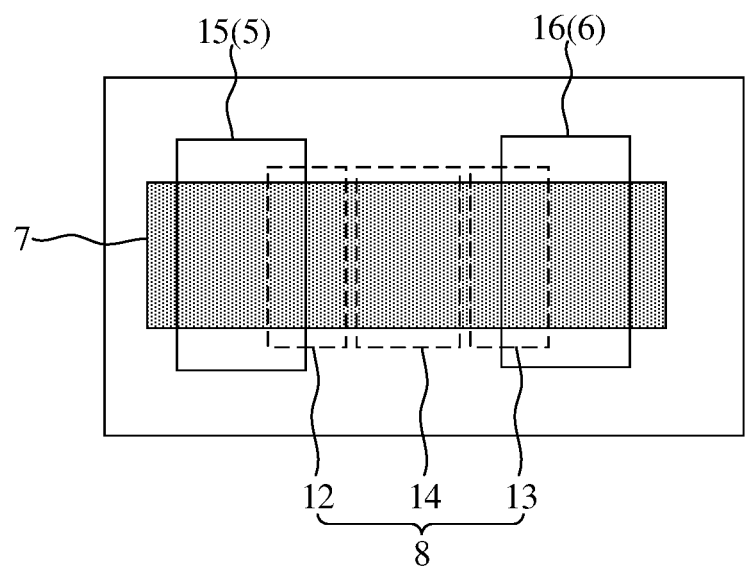
FIG. 4 is a top view of a metal oxide transistor according to an embodiment of the present disclosure.

FIG. 4 is a plan view of a metal oxide transistor according to an embodiment of the present disclosure. In an embodiment, as shown in FIG. 4, on a plane where any one of active sub-layers 7 is located, the source electrode 5 has a first orthographic projection 15, the drain electrode 6 has a second orthographic projection 16, and a first semiconductor zone 12 is located at a side of the third semiconductor zone 14 close to the first orthographic projection 15, or a second semiconductor zone 13 is located at a side of the third semiconductor zone 14 close to the second orthographic projection 16.

In the present disclosure, in addition to longitudinally differentiating the oxygen ion doping concentration of the plurality of active sub-layers 7, the oxygen ion doping concentration of a single active sub-layer 7 is further varied laterally. In an embodiment, the oxygen ion doping concentration in the first semiconductor zone 12 is lower than the oxygen ion doping concentration in the third semiconductor zone 14, or the oxygen ion doping concentration in the second semiconductor zone 13 is lower than the oxygen ion doping concentration in the third semiconductor zone 14, such that the ion doping concentration of the part of the semiconductor zone 8 close to the drain electrode 6 or of the drain electrode 6 is lower, and then the electron mobility in the part of the semiconductor zone 8 is higher. In this way, the distribution uniformity of carriers in the whole semiconductor region 8 is improved while the energy barriers among the source electrode 5, the drain electrode 6 and the channel of the active sub-layer 7 are reduced.

Figure 5:
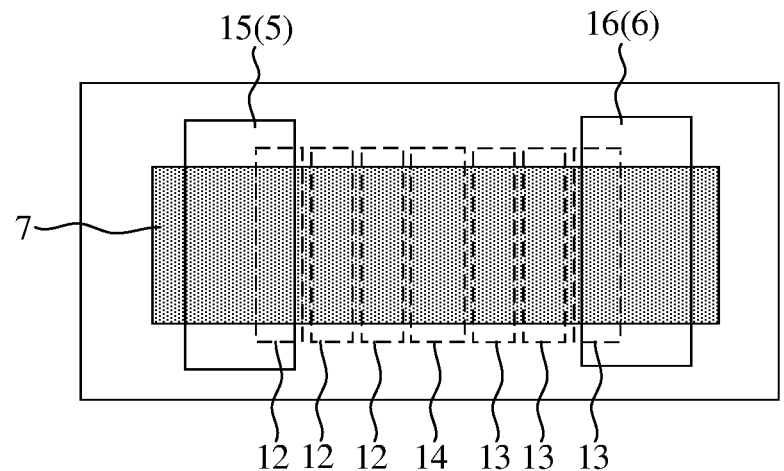
FIG. 5 is a top view of a metal oxide transistor according to another embodiment of the present disclosure.

FIG. 5 is a top view of a metal oxide transistor according to another embodiment of the present disclosure. Further, as shown in FIG. 5, the semiconductor zone 8 includes a plurality of first semiconductor zones 12 and a plurality of second semiconductor zones 13. The plurality of first semiconductor zones 12 has an oxygen ion doping concentration gradually reducing along a direction from the third semiconductor zone 14 to the first semiconductor zone 12, or the plurality of second semiconductor zones 13 has an oxygen ion doping concentration gradually decreasing along a direction from the third semiconductor zone 14 to the second semiconductor zone 13. With such a configuration, the distribution uniformity of carriers in the whole semiconductor region 8 is improved while the energy barriers among the source electrode 5, the drain electrode 6 and the channel of the active sub-layer 7 are reduced.

Figure 6:
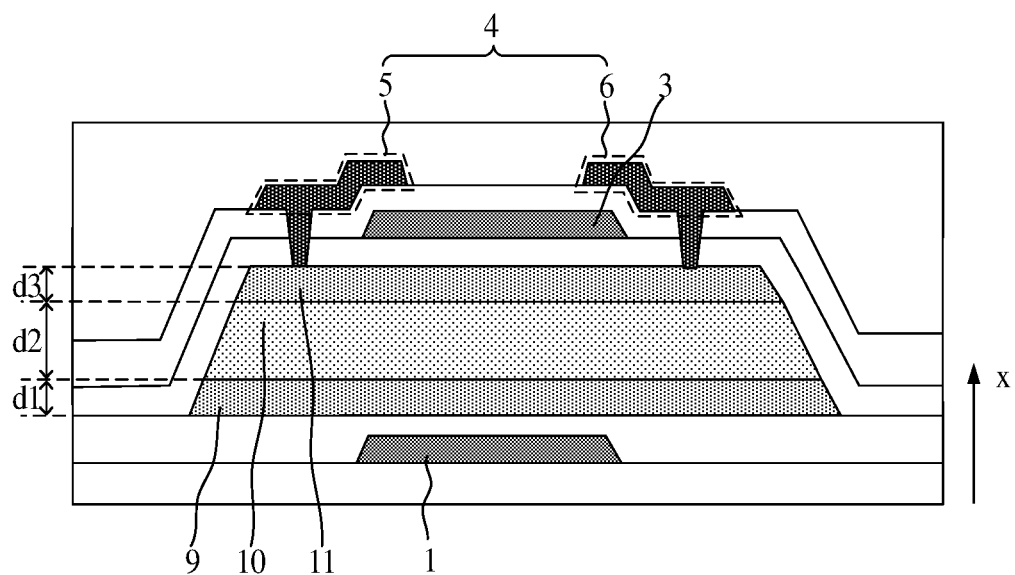
FIG. 6 is a structural schematic view showing a metal oxide transistor according to another embodiment of the present disclosure.

FIG. 6 is a structural schematic view showing a metal oxide transistor according to another embodiment of the present disclosure. In an embodiment, as shown in FIG. 6, a direction along which the first gate electrode 1, the active layer 2, the second gate electrode 3 and the source-drain electrode 4 are stacked is a first direction x. The first active sub-layer 9 has a thickness d1 in the first direction x, the second active sub-layer 10 has a thickness d2 in the first direction x, and the third active sub-layer 11 has a thickness d3 in the first direction x, where d2>d1, and d2>d3.

For example, when the total thickness of the active layer 2 is 40 nm, the first active sub-layer 9 and the third active sub-layer 11 have a thickness of 10 nm, respectively, and the second active sub-layer 10 has a thickness of 20 nm.

When the total thickness of the active layer 2 is constant, if the thickness of the second active sub-layer 10 is larger than the thickness of the first active sub-layer 9 and the third active sub-layer 11, a proportion of the thickness of the second active sub-layer 10 in the whole active layer 2 can be increased, such that the second active sub-layer 10 is used to a greater extent to further reduce the off-state leakage current of the transistor. Moreover, since the channels formed in the first active sub-layer 9 and the third active sub-layer 11 are relatively narrow in the first direction x, the first active sub-layer 9 and the third active sub-layer 11 are not required to be too thick, thereby avoiding increasing the overall thickness of stacked layers of the transistor.

Figure 7:
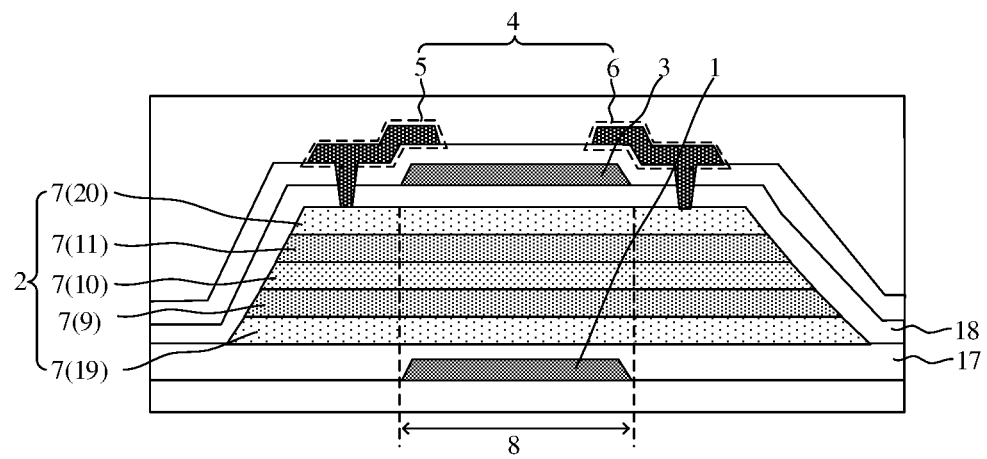
FIG. 7 is a structural schematic view showing a metal oxide transistor according to another embodiment of the present disclosure.
Figure 8:
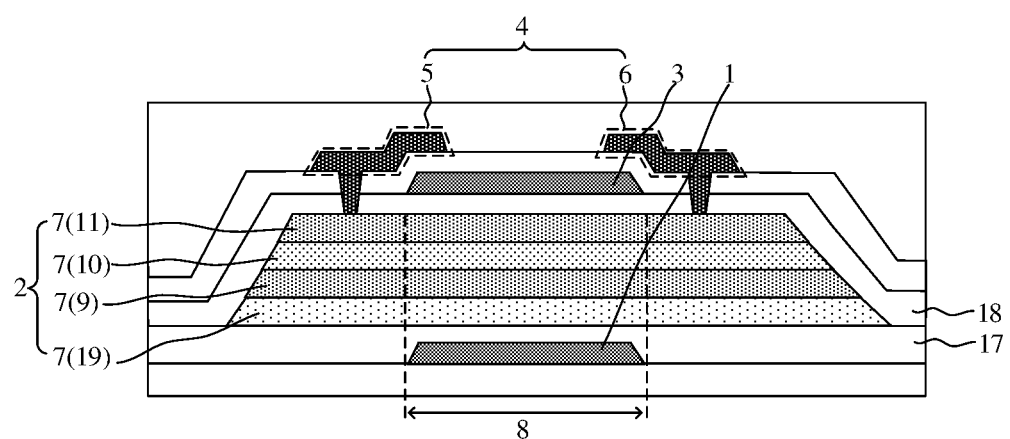
FIG. 8 is a structural schematic view showing a metal oxide transistor according to another embodiment of the present disclosure.
Figure 9:
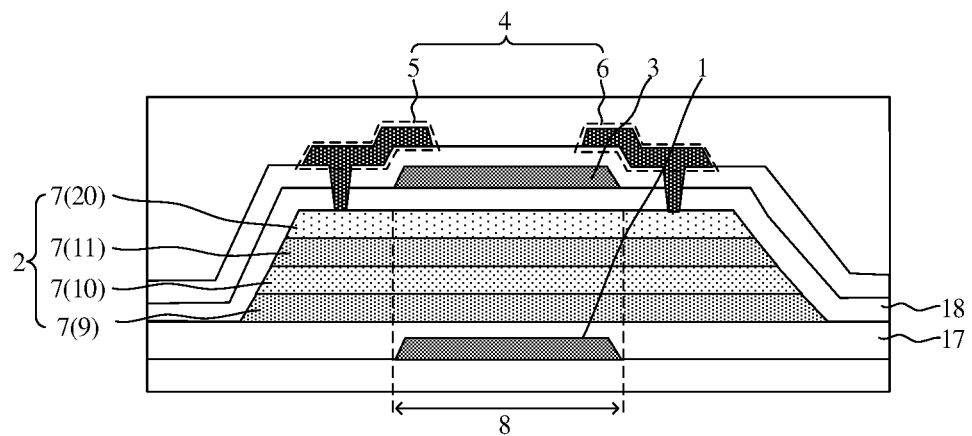
FIG. 9 is a structural schematic view showing a metal oxide transistor according to another embodiment of the present disclosure.

FIG. 7 is a structural schematic view showing a metal oxide transistor according to another embodiment of the present disclosure, FIG. 8 is a structural schematic view showing a metal oxide transistor according to another embodiment of the present disclosure, and FIG. 9 is a structural schematic view showing a metal oxide transistor according to another embodiment of the present disclosure. In an embodiment, as shown in FIG. 7 to FIG. 9, the metal oxide transistor further includes a first insulating layer 17 and a second insulating layer 18. The first insulating layer 17 is located between the first active sub-layer 9 and the first gate electrode 1. The second insulating layer 18 is located between the third active sub-layer 11 and the second gate electrode 3.

The plurality of active sub-layers 7 further includes a fourth active sub-layer 19 and/or a fifth active sub-layer 20. For example, referring to FIG. 7, the plurality of active sub-layers 7 further includes the fourth active sub-layer 19 and the fifth active sub-layer 20, or referring to FIG. 8, the plurality of active sub-layers 7 further includes the fourth active sub-layer 19, or, referring to FIG. 9, the plurality of active sub-layers 7 further includes the fifth active sub-layer 20. The fourth active sub-layer 19 is located between the first active sub-layer 9 and the first insulating layer 17. The fourth active sub-layer 19 includes the same metal oxide as the first active sub-layer 9. The semiconductor zone 8 of the four active sub-layer 19 has an oxygen ion doping concentration $C_{O\_4}$, where $C_{O\_4} > C_{O\_1}$. The fifth active sub-layer 20 is located between the third active sub-layer 11 and the second insulating layer 18. The fifth active sub-layer 20 includes the same metal oxide as the third active sub-layer 11. A semiconductor zone of the fifth active sub-layer 20 has an oxygen ion doping concentration $C_{O\_5}$, where $C_{O\_5} > C_{O\_3}$.

It can be understood that the active sub-layer 7 includes a metal oxide, but the insulating layer includes an inorganic insulating material. The materials of the active sub-layer 7 and the insulating layer are quite different, such that the crystal lattices of them are quite different. Taking the first active sub-layer 9, the fourth sub-insulating layer 19 and the first insulating layer 17 as an example, the fourth active sub-layer 19 is added between the first active sub-layer 9 and the first insulating layer 17, such that the first active sub-layer 9 is spaced apart from the first insulating layer 17. Since the fourth active sub-layer 19 and the first active sub-layer 9 include the same metal oxide, the difference between the lattices of the fourth active sub-layer 19 and the first active sub-layer 9 is small, thereby further reducing the off-state leakage current of the transistor.

Moreover, it should be noted that although the fourth active sub-layer 19 is located at a side close to the first gate electrode 1, since the oxygen ion doping concentration $C_{0-4}$ of the fourth active sub-layer 19 is higher than the oxygen ion doping concentration $C_{O\_1}$ of the first active sub-layer 9, the oxygen vacancy concentration of the fourth active sub-layer 19 is relatively low, such that it is difficult for the fourth active sub-layer 19 to form a channel, and the channel is still formed in the first active sub-layer 9.

The same principle applies for the third active sub-layer 11, the fifth active sub-layer 20, and the second insulating layer 18, which will not be elaborated here.

In an embodiment, $C_{O\_4} > C_{O\_2}$, and $C_{O\_5} > C_{O\_2}$. With such configuration, among the plurality of active sub-layers 7, the fourth active sub-layer 19 and the fifth active sub-layer 20 have the highest oxygen ion doping concentrations, and have the lowest number of oxygen vacancies, thus greatly reducing the electron mobility of the fourth active sub-layer 19 and the fifth active sub-layer 20 and forming the channel still in the first active sub-layer 9 and the third active sub-layer 11.

In another embodiment, when $C_{O\_2} > C_{O\_4}$, $C_{O\_2} > C_{O\_5}$, the semiconductor zone 8 of the second active sub-layer 10 has the highest oxygen ion doping concentration and the lowest electron mobility, such that the second active sub-layer 10 is used to a greater extent to reduce the off-state leakage current of the transistor, and the influence of the second active sub-layer 10 on the conductivity of the transistor is ignored to a greater extent when the transistor is turned on.

Further, $C_{O\_4} = C_{O\_5}$, i.e., the oxygen ion doping concentration of the semiconductor zone 8 of the fourth active sub-layer 19 is the same as the oxygen ion doping concentration of the semiconductor zone 8 of the fifth active sub-layer 20, such that the oxygen concentration ratios required by the processes for forming the fourth active sub-layer 19 and the fifth active sub-layer 20 are the same, thereby simplifying the process of the active layer 2.

It should be noted that, in an embodiment of the present disclosure, the fourth active sub-layer 19 and the fifth active sub-layer 20 may include one or more metal oxides selected from IGZO, ZnO, SnO, IZO, GaZnO, ZTO and ITO, etc., respectively.

In an embodiment, each of the first active sub-layer 9, the third active sub-layer 11, the fourth active sub-layer 19, and the fifth active sub-layer 20 includes an indium-gallium-zinc oxide. Further, when the second active sub-layer 10 may also include the indium-gallium-zinc oxide, five active sub-layers 7 included in the active layer 2 all include the indium-gallium-zinc oxide.

At this time, the semiconductor zone 8 of the first active sub-layer 9 has an indium ion doping concentration $C_{In\_1}$, and the semiconductor zone 8 of the fourth active sub-layer 19 has an indium ion doping concentration $C_{In\_4}$, where $C_{In\_4} < C_{In\_1}$; the semiconductor zone 8 of the third active sub-layer 11 has an indium ion doping concentration $C_{In\_3}$, and the semiconductor zone 8 of the fifth active sub-layer 20 has an indium ion doping concentration $C_{In\_5}$, where $C_{In\_3} < C_{In\_5}$; and/or, the semiconductor zone 8 of the first active sub-layer 9 has a gallium ion doping concentration $C_{Ga\_1}$, and the semiconductor zone 8 of the fourth active sub-layer 19 has a gallium ion doping concentration $C_{Ga\_4}$, $C_{Ga\_4} > C_{Ga\_1}$, and the semiconductor zone 8 of the active sub-layer 11 has a gallium ion doping concentration $C_{Ga\_3}$, and the semiconductor zone 8 of the fifth active sub-layer 20 has a gallium ion doping concentration $C_{Ga\_5}$, where $C_{Ga\_5} > C_{Ga\_3}$.

Taking the plurality of active sub-layers 7 including the fourth active sub-layer 19 and the fifth active sub-layer 20 as an example, in an embodiment of the present disclosure, $C_{In\_4} < C_{In\_1}$, $C_{In\_3} < C_{In\_5}$, and, $C_{Ga\_4} > C_{Ga\_1}$, $C_{Ga\_5} > C_{Ga\_3}$; or, $C_{In\_4} < C_{In\_1}$, $C_{In\_3} < C_{In\_5}$; or, $C_{Ga\_4} > C_{Ga\_1}$, $C_{Ga\_5} > C_{Ga\_3}$.

On the basis of the above analysis of the influence of indium ions and gallium ions on the carrier concentration, it is known that indium ions can increase electron mobility, while gallium ions can reduce electron mobility. The carrier concentration of the fourth active sub-layer 19 can be further reduced by reducing the doping concentration of indium ions of the fourth active sub-layer 19 or increasing the gallium ion doping concentration of the fourth active sub-layer 19, such that the fourth active sub-layer 19 only plays a role in reducing the interface defects of the first active sub-layer 9 and reducing the off-state leakage current of the transistor, but does not play a role in forming a channel. The same principle applies for the fifth active sub-layer 20, which will not be elaborated here.

Figure 10:
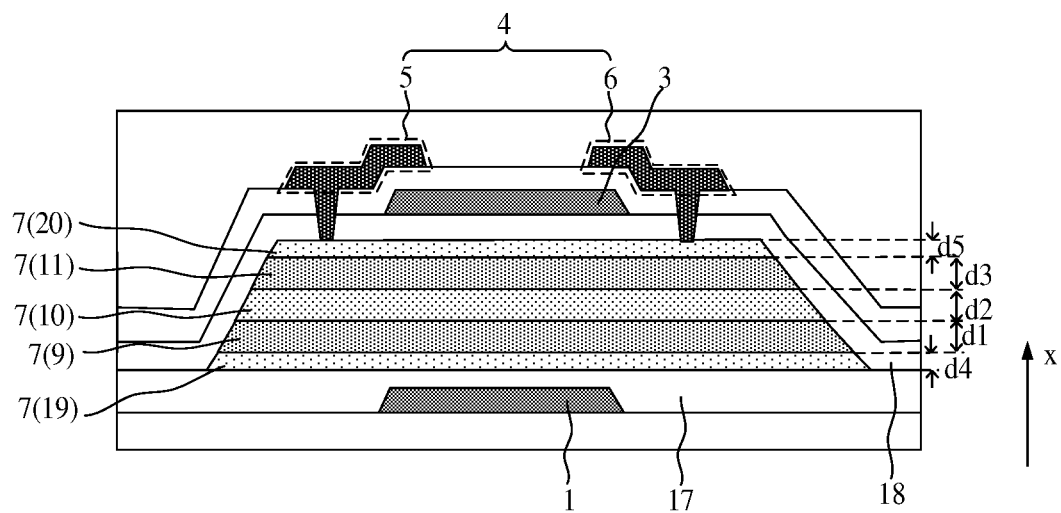
FIG. 10 is a structural schematic view showing a metal oxide transistor according to another embodiment of the present disclosure.

FIG. 10 is a structural schematic view showing a metal oxide transistor according to another embodiment of the present disclosure. In an embodiment, as shown in FIG. 10, a direction along which the first gate electrode 1, the active layer 2, the second gate electrode 3 and the source-drain electrode 4 are stacked is a first direction x. The first active sub-layer 9 has a thickness d1 in the first direction x, the fourth active sub-layer 19 has a thickness d4 in the first direction x, where d4<d1. The third active sub-layer 11 has a thickness d3 in the first direction x, and the fifth active sub-layer 20 has a thickness d5 in the first direction x, where d5<d3. At this time, the fourth active sub-layer 19 and the fifth active sub-layer 20 are thinner and have a lower carrier concentration, therefore, it is difficult to generate channels.

Further, the second active sub-layer 10 has a thickness d2 in the first direction x, where d4<d1<d2, d5<d3<d2, and d1=d3, d4=d5. For example, when an overall thickness of the active layer 2 is 40 nm, the first active sub-layer 9, the second active sub-layer 10, and the third active sub-layer 11 have a thickness of 10 nm, respectively. The fourth active sub-layer 19 and the fifth active sub-layer 20 have a thickness of 5 nm, respectively.

Further, a direction along which the first gate electrode 1, the active layer 2, the second gate electrode 3, and the source-drain electrode 4 are stacked is a first direction x. The fourth active sub-layer 19 has a thickness d4 in the first direction x, where d4≤5 nm, and the fifth active sub-layer 20 has a thickness d5 in the first direction x, where d5≤5 nm.

With such a configuration, a total thickness of the active layer 2 can be reduced while preventing the fourth active sub-layer 19 and the fifth active sub-layer 20 from forming a channel, further reducing the overall thickness of stacked layers of the transistor. In addition, in order to reduce the overall thickness of the stacked layers of the transistor, the overall thickness of the active layer 2 can be set in a range from 20 nm to 40 nm, and the thicknesses of the fourth active sub-layer 19 and the fifth active sub-layer 20 can be set within 5 nm, such as 2 nm, 3 nm, etc. Therefore, the thickness of the layer is more matched with the overall thickness of the active layer, and is more reasonable.

Figure 11:
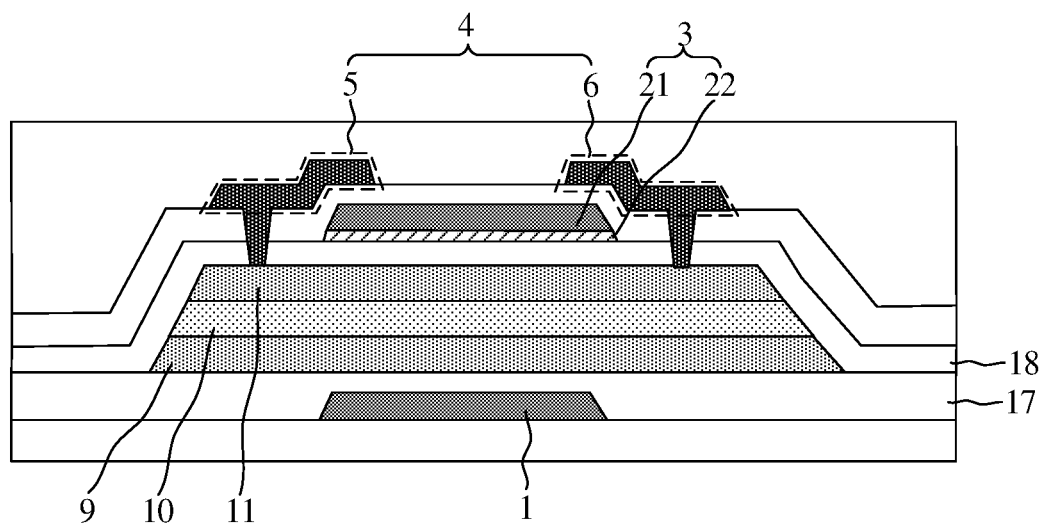
FIG. 11 is a structural schematic view showing a metal oxide transistor according to another embodiment of the present disclosure.

FIG. 11 is a structural schematic view showing a metal oxide transistor according to another embodiment of the present disclosure. In an embodiment, as shown in FIG. 11, the second gate electrode 3 includes a main gate electrode portion 21 and an auxiliary gate electrode portion 22. The auxiliary gate electrode portion 22 is located at a side of the main gate electrode portion 21 facing the active layer 2.

In an embodiment, after the second insulating layer 18 is formed, the auxiliary gate electrode portion 22 is first formed of a titanium metal material by an etching process, and then the main gate electrode portion 21 is formed of a metal molybdenum material by an etching process. The orthographic projection of the main gate electrode portion 21 on the plane where the second insulating layer 18 is located overlaps with the orthographic projection of the auxiliary gate electrode portion 22 on the plane where the second insulating layer 18 is located. The thickness of the auxiliary gate electrode portion 22 in the first direction x is smaller than the thickness of the main gate electrode portion 21 in the first direction x.

Based on the above structure, the auxiliary gate electrode portion 22 can have a protective effect. On the one hand, the metal titanium material used in the auxiliary gate electrode portion 22 is relatively stable and has strong corrosion resistance, and the titanium dioxide generated after oxidation will adhere on the surface of the titanium metal to form a dense protective layer, preventing the molybdenum ions of the main gate electrode 21 from diffusing into the active layer 2. On the other hand, when impurities, such as water and oxygen, penetrate into the transistor, the auxiliary gate electrode 22 is also possible to prevent water and oxygen from further corroding into the active layer 2, thereby avoiding affecting the performance of the active layer 2.

Figure 12:
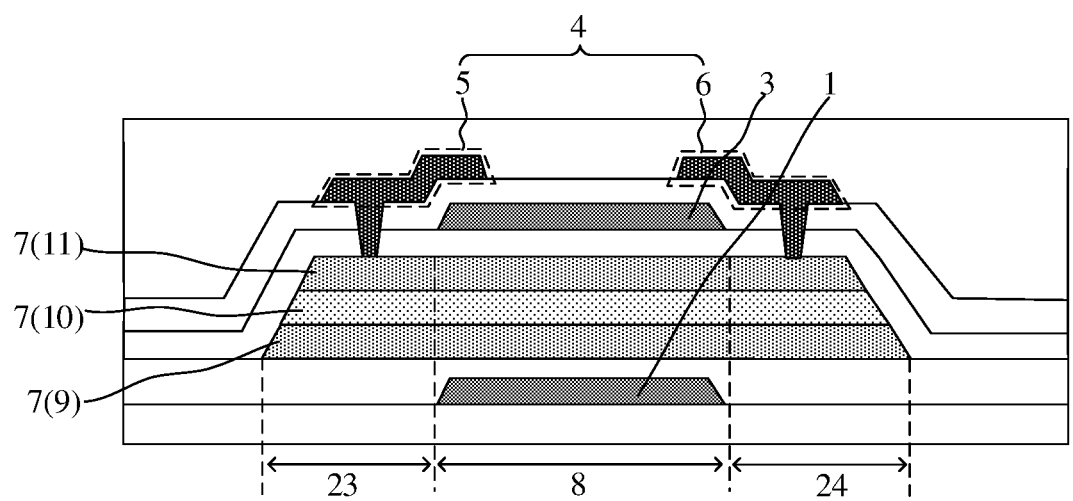
FIG. 12 is a structural schematic view showing a metal oxide transistor according to another embodiment of the present disclosure.

FIG. 12 is a structural schematic view showing a metal oxide transistor according to another embodiment of the present disclosure. In an embodiment, as shown in FIG. 12, the active sub-layer 7 further includes a first conductive zone 23 and a second conductive zone 24. The source electrode 5 is electrically connected to the first conductive zone 23, and the drain electrode 6 is electrically connected to the second conductive zone 24.

When a conduction voltage for driving the transistors to turn on is applied to the first gate electrode 1 and the second gate electrode 3, the semiconductor zones 8 of the first active sub-layer 9 and the second active sub-layer 10 form channels which communicate with the first conductive zone 23 and the second conductive zone 24, respectively, thereby forming a conductive path between the source electrode 5 and the drain electrode 6 to achieve the normal operation of the transistor.

It should be noted that in the plurality of active sub-layers 7 included in the active layer 2, the source electrode 5 and the drain electrode 6 can be electrically connected to the first conductive zone 23 and the second conductive zone 24 of an active sub-layer 7 closest to them, respectively. For example, referring to FIG. 12, when the active layer 2 includes three active sub-layers 7 (i.e., the first active sub-layer 9, the second active sub-layer 10 and the third active sub-layer 11), the source electrode 5 and the drain electrode 6 are electrically connected to the first conductive zone 23 and the second conductive zone 24 of the third active sub-layer 11, respectively.

In addition, it should be noted that, in the present disclosure, hydrogen ions or boron ions can be injected into the active sub-layer 7 by a plasma injection process thereby making the active sub-layer 7 to be conductive, and then a first conductive zone 23 and a second conductive zone 24 are formed in the active sub-layer 7. Moreover, after a plurality of active sub-layers 7 are formed, the plurality of active sub-layers 7 can be simultaneously conducted, thereby simplifying the technological processes.

Figure 13:
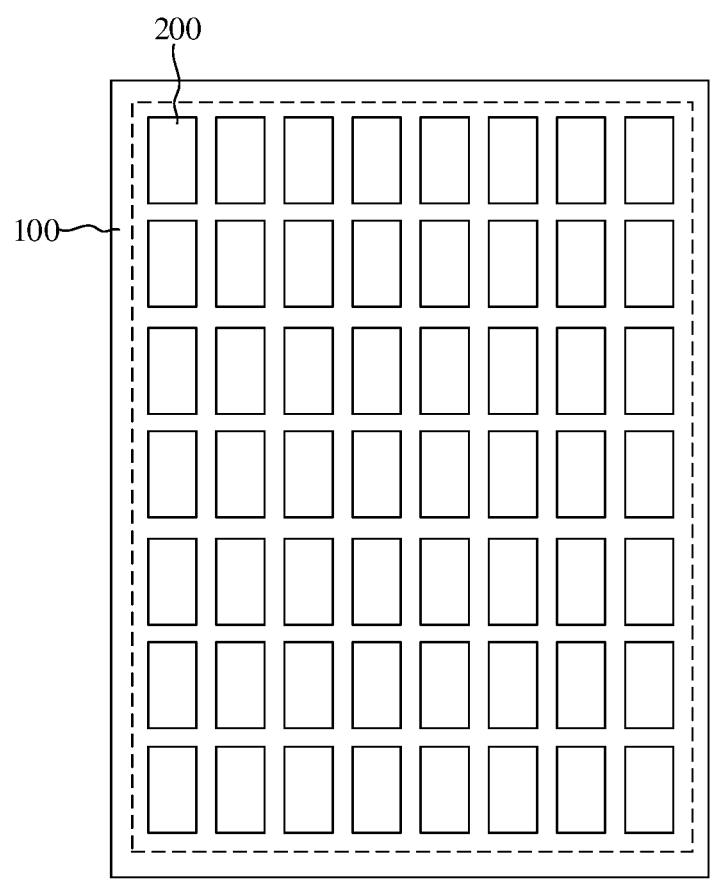
FIG. 13 is a structural schematic view showing a display panel according to an embodiment of the present disclosure.

Based on the same inventive concept, the present disclosure also provides a display panel. FIG. 13 is a structural schematic view showing a display panel according to an embodiment of the present disclosure. As shown in FIG. 13, the display panel includes a substrate 100 and a plurality of pixel circuits 200 located at a side of the substrate 100. The pixel circuit 200 includes the above metal oxide transistor.

On the basis of the analysis of the above embodiments, it is known that since the metal oxide transistor has the characteristics of low off-state leakage current and high conductivity, the components have better performances. Therefore, when the pixel circuit 200 includes the above metal oxide transistor, the pixel circuit 200 has a better reliability, further improving the display performance of the display panel.

Figure 14:
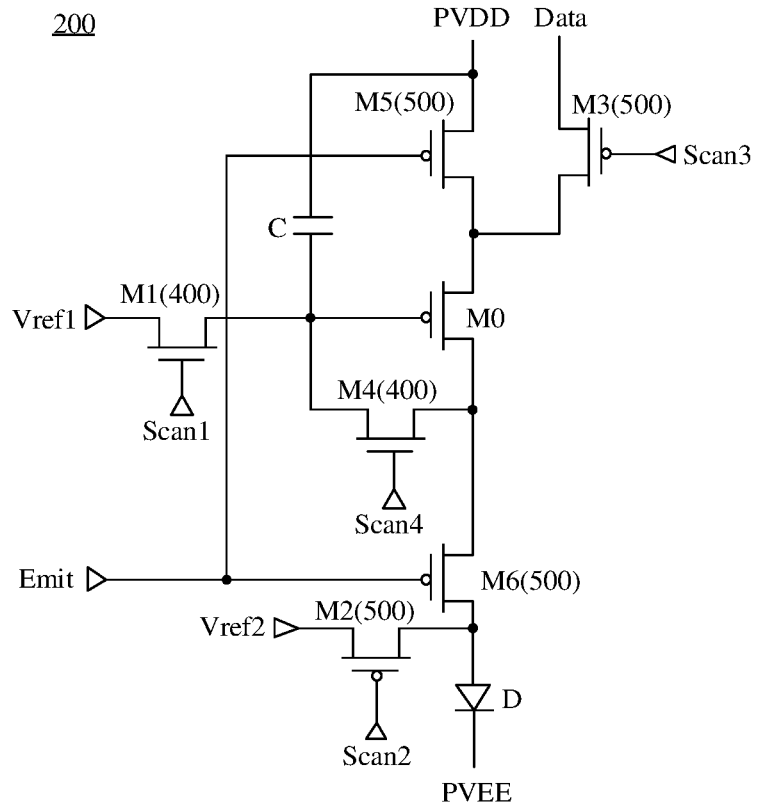
FIG. 14 is a structural schematic view showing a pixel circuit according to an embodiment of the present disclosure.

FIG. 14 is a structural schematic view showing a pixel circuit according to an embodiment of the present disclosure. In an embodiment, as shown in FIG. 14, the pixel circuit 200 includes a driving transistor M0 and a type-I switching transistor 400. The source electrode 5 or the drain electrode 6 of the type-I transistor 400 are directly connected to the gate electrode of the driving transistor M0. The type-I switching transistor 400 is a metal oxide transistor.

It should be noted that "the source electrode 5 or drain electrode 6 of the type-I switching transistor 400 is directly connected to the gate electrode of the driving transistor M0" means that the source electrode 5 or drain electrode 6 of the type-I switching transistor 400 is in direct contact with the gate electrode of the driving transistor M0, or, there is only a connection trace between the source electrode 5 or drain electrode 6 of the type-I switching transistor 400 and the gate electrode of the driving transistor M0. There are no other circuit components, such as a transistor, a diode, or a capacitor, between the source electrode 5 or the drain electrode 6 of the type-I switching transistor 400 and the gate electrode of the driving transistor M0.

Taking the structure of the pixel circuit 200 shown in FIG. 14 as an example, the pixel circuit 200 includes a driving transistor M0, a first transistor M1 to a sixth transistor M6, and a storage capacitor C.

A gate electrode of the first transistor M1 is electrically connected to a first scan signal line Scan1, a source electrode of the first transistor M1 is electrically connected to a first reset signal line Vref1, and a drain electrode of the first transistor M1 is electrically connected to a gate electrode of the driving transistor M0.

A gate electrode of the second transistor M2 is electrically connected to a second scan signal line Scan2, a source electrode of the second transistor M2 is electrically connected to a second reset signal line Vref2, and a drain electrode of the second transistor M2 is electrically connected to an anode of an organic light-emitting diode D.

A gate electrode of the third transistor M3 is electrically connected to a third scan signal line Scan3, a source electrode of the third transistor M3 is electrically connected to a data line Data, and a drain electrode of the third transistor M3 is electrically connected to a source electrode of the driving transistor M0.

A gate electrode of the fourth transistor M4 is electrically connected to a fourth scanning signal line Scan4, a source electrode of the fourth transistor M4 is electrically connected to a drain electrode of the driving transistor M0, and a drain electrode of the fourth transistor M4 is electrically connected to the gate electrode of the driving transistor M0.

A gate electrode of the fifth transistor M5 is electrically connected to a light-emitting control signal line Emit, a source electrode of the fifth transistor M5 is electrically connected to a power signal line PVDD, and a drain electrode of the fifth transistor M5 is electrically connected to the source electrode of the driving transistor M0.

A gate electrode of the sixth transistor M6 is electrically connected to the light-emitting control signal line Emit, a source electrode of the sixth transistor M6 is electrically connected to the drain electrode of the driving transistor M0, and a drain electrode of the sixth transistor M6 is electrically connected to the anode of the organic light-emitting element D.

A first plate of a storage capacitor C is electrically connected to the power signal line PVDD, and a second plate of the storage capacitor C is electrically connected to the gate electrode of the driving transistor M0.

Figure 15:
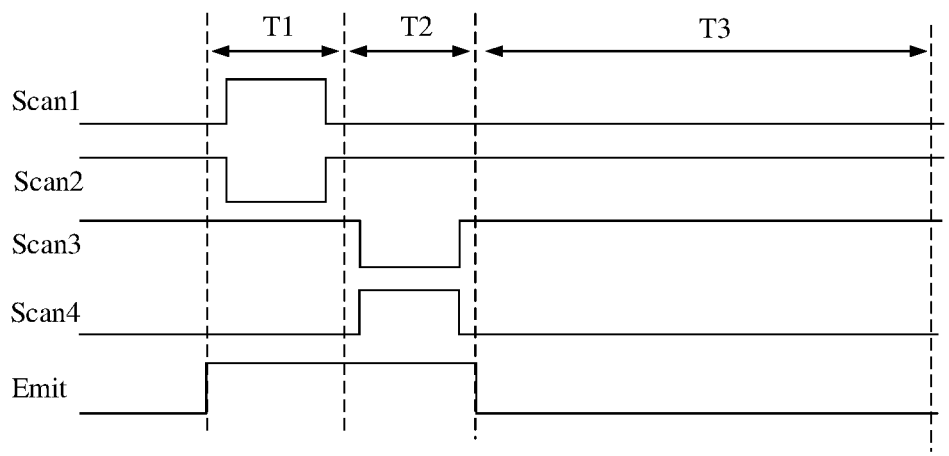
FIG. 15 is a timing sequence view corresponding to FIG. 14 according to an embodiment of the present disclosure.

Referring to the timing sequence diagram shown in FIG. 15, a driving period of the pixel circuit 200 includes an initialization period T1, a charging period T2, and a light-emitting period T3.

In the initialization period T1, the first transistor M1 is turned on under the action of the first scan signal, the second transistor M2 is turned on under the action of the second scan signal, the gate electrode of the driving transistor M0 is reset by using the first reset signal, and the anode of the organic light-emitting element D is reset by using the second reset signal.

In the charging period T2, the third transistor M3 is turned on under the action of the third scan signal, the fourth transistor M4 is turned on under the action of the fourth scan signal, the gate electrode of the driving transistor M0 is charged and performs the threshold compensation by using the data signal.

In the light-emitting period T3, the fifth transistor M5 and the sixth transistor M6 are turned on under the action of the light-emitting control signal, and the organic light-emitting diode D is driven to emit light under the action of a driving current converted by the power signal and the data signal.

It should be noted that the gate electrode of the driving transistor M0 and the anode of the organic light-emitting element D can be reset by using different reset signals, and the reset voltage of the second reset signal can be set lower than the reset voltage of the first reset signal, such that the anode potential of the organic light-emitting element D is lowered to a greater extent, thereby improving the light leak problem of the sub-pixels. Meanwhile, the reset voltage of the first reset signal is slightly higher, a data signal can be written on the basis of a slightly higher potential when the data signal is written into the gate electrode of the drive transistor M0, such that a voltage difference between the initial potential of the gate electrode of the drive transistor M0 and the data signal required to be written can be reduced, thereby causing the data signal can be more fully written.

In the pixel circuit 200 with the above structure, the drain electrodes 6 of the first transistor M1 and the fourth transistor M4 are directly connected to the gate electrode of the driving transistor M0, therefore, the first transistor M1 and the fourth transistor M4 are the type-I switching transistor 400. At this time, the gate electrode of the first transistor M1 represents the first gate electrode 1 and the second gate electrode 3 of the first transistor M1, and the gate electrode of the second transistor M2 represents the first gate electrode 1 and the second gate electrode 3 of the second transistor M2, and the first gate electrode 1 and the second gate electrode 3 of the above two transistors receive the same one first scan signal. It should be noted that, taking the first transistor M1 as an example, when the first gate electrode 1 and the second gate electrode 3 of the first transistor M1 receive the same one scan signal, the first gate electrode 1 and the second gate electrode 3 can be connected to the same one scanning signal line, or connected to different scanning signal lines, but the two scanning signal lines transmit the same signal at the same time moment.

Since the source electrode 5 or drain electrode 6 of the type-I switching transistor 400 is directly connected to the gate electrode of the driving transistor M0, if the off-state leakage current of the type-I switching transistor 400 is large, during the light-emitting period, the off-state leakage current of the type-I switching transistor 400 can have a greater impact on the gate potential of the driving transistor M0, thereby affecting the turn-on state of the driving transistor M0, and further causing the brightness of the organic light-emitting element D to deviate from a standard value. The type-I switching transistor 400 is set as the above-mentioned metal oxide transistor, since the off-state leakage current of this type of the transistor is low, the influence of this type of the transistor on the gate potential of the driving transistor M0 can be reduced, thereby improving the light-emitting reliability of the display panel.

In addition, it should be noted that compared with the existing transistor structure, the metal oxide transistor provided by the present disclosure has lower off-state leakage, therefore, the lower off-state leakage current can be achieved when the first transistor M1 and the second transistor M2 use the metal oxide transistor structure provided by the present disclosure. For this purpose, compared with the related art, the off-state leakage currents of the first transistor M1 and the second transistor M2 have smaller influence on the gate potential of the driving transistor M0. Therefore, the present disclosure can increase the duration of the turn-off time of the first transistor M1 and the second transistor M2 to a certain extent, i.e., increasing the duration of the light-emitting period in the driving cycle, such that the pixel circuit 200 in the display panel is refreshed at a lower driving frequency. Therefore, the pixel circuit 200 provided by the present disclosure can be applied to lower frequency refresh, which not only reduces the power consumption of the display panel, but also increases the range of the refresh frequency of the display panel. Therefore, it can be operated under a low or high refresh frequency.

In addition, it should be noted that, referring to FIG. 14, the pixel circuit 200 further includes a type-II switching transistor 500. The source electrode and drain electrode of the type-II switching transistor 500 are not directly connected to the gate electrode of the driving transistor M0. In an embodiment, the type-II switching transistor 500 may be a low-temperature polycrystalline transistor, that is, the pixel circuit 200 may include two types of transistors, i.e., a low-temperature polycrystalline transistor and a metal oxide transistor.

It should be noted that "the source electrode and drain electrode of the type-II switching transistor 500 are not directly connected to the gate electrode of the driving transistor M0" means that there are other circuit components, such as transistors, diodes, or capacitors between the source electrode or drain electrode of the type-II switching transistor 500 and the gate electrode of the driving transistor M0, and the source electrode or drain electrode of the type-II switching transistor 500 is indirectly electrically connected to the gate electrode of the driving transistor M0. In the circuit structure shown in FIG. 14, the second transistor M2, the third transistor M3, the fifth transistor M5, and the sixth transistor M6 are the type-II switching transistor 500.

Since the source electrode and the drain electrode of the type-II switching transistor 500 are not directly connected to the gate electrode of the driving transistor M0, the off-state leakage current of the type-II switching transistor 500 will not directly act on the gate electrode of the driving transistor M0, such that it has a small influence on the gate potential of the driving transistor M0. Moreover, since the low-temperature polycrystalline transistor has high stability, setting the type-II switching transistor 500 as a low-temperature polycrystalline transistor can improve the reliability of the pixel circuit 200.

Figure 16:
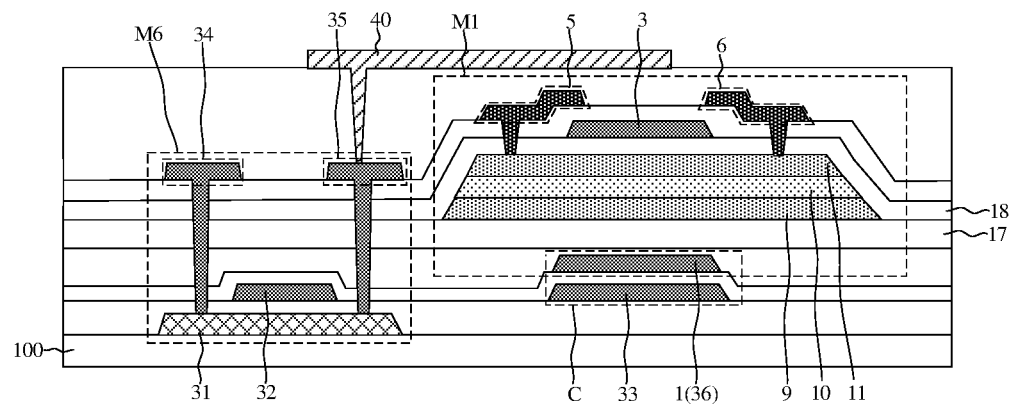
FIG. 16 is a partial structural schematic view showing a layer corresponding to the pixel circuit shown in FIG. 14 according to an embodiment of the present disclosure.

FIG. 16 is a partial structural schematic view showing a layer corresponding to the pixel circuit shown in FIG. 14 according to an embodiment of the present disclosure. Further, as shown in FIG. 16, FIG. 16 schematically shows the first transistor M1, the sixth transistor M6, and the storage capacitor C in the pixel circuit 200. In an embodiment of the present disclosure, the active layer 31 of the sixth transistor M6 is located at a side of the gate electrode 32 of the sixth transistor M6 facing the substrate 100. The active layer 31 includes a low-temperature polycrystalline material. The gate electrode 32 of the sixth transistor M6 is in the same layer as the first plate 33 of the storage capacitor C, and the drain electrode 35 of the sixth transistor is electrically connected to the anode 40 of the organic light-emitting diode D. In an embodiment, the source electrode 34 and the drain electrode 35 of the sixth transistor M6 can be in the same layer as the source electrode 5 and the drain electrode 6 of the first transistor M1. In another embodiment, the source electrode 34 and the drain electrode 35 of the sixth transistor M6 can be located in a different layer from the source electrode 5 and the drain electrode 6 of the first transistor M1. In addition, the first gate electrode 1 of the first transistor M1 is multiplexed with the second plate 36 of the storage capacitor C to simplify the process flow and reduce the space occupied by the layers.

Figure 17:
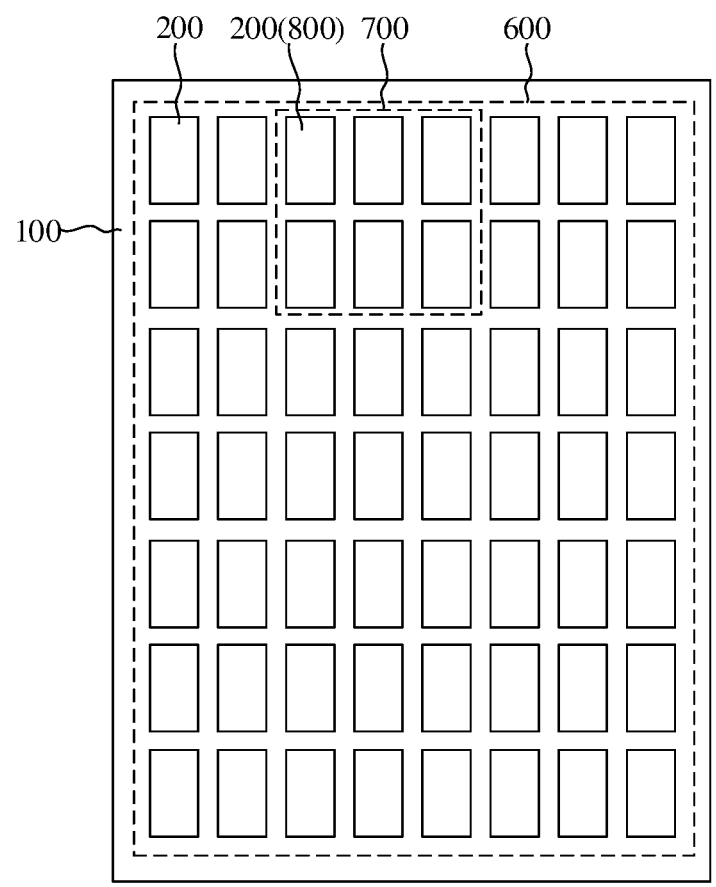
FIG. 17 is a structural schematic view showing a display panel according to another embodiment of the present disclosure.

FIG. 17 is a structural schematic view showing a display panel according to another embodiment of the present disclosure. In another embodiment, as shown in FIG. 17, the display panel further includes a display zone 600. The display zone 600 includes an optical component arrangement zone 700. The optical component arrangement zone 700 can be used for displaying, and the corresponding position of the optical component arrangement zone 700 can be provided with optical components, such as a camera, for achieving functions of the display panel, such as photographing and video recording.

Figure 18:
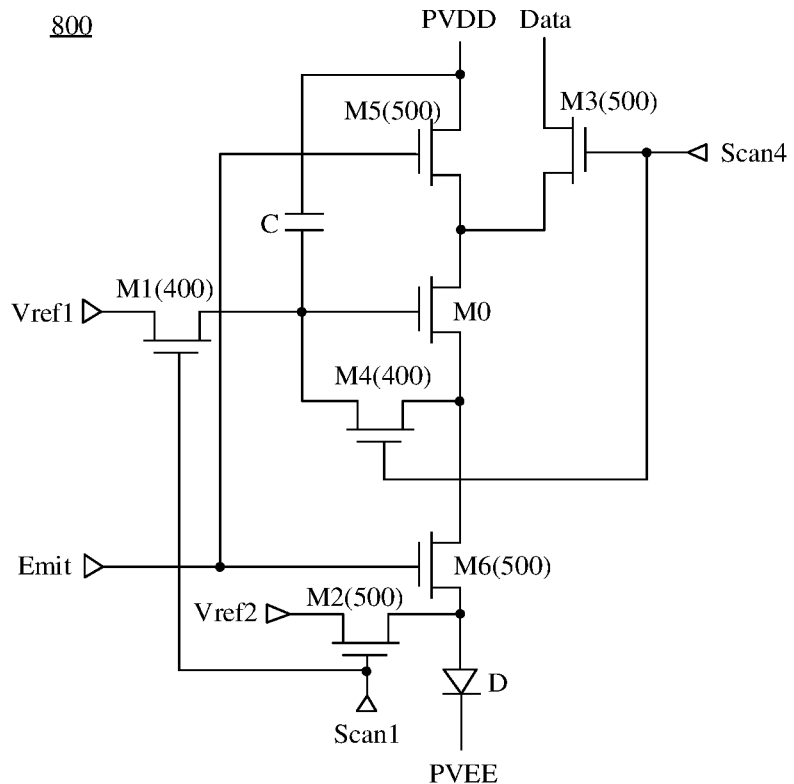
FIG. 18 is a structural schematic view showing a pixel circuit according to another embodiment of the present disclosure.

FIG. 18 is a structural schematic view showing a pixel circuit according to another embodiment of the present disclosure. With reference to FIG. 17 and as shown in FIG. 18, the pixel circuit 200 further includes a type-II switching transistor 500. A source electrode and a drain electrode of the type-II switching transistor 500 are not directly connected to the gate electrode of the driving transistor M0. The pixel circuit 200 located in the optical component arrangement zone 700 is a first pixel circuit 800. In the first pixel circuit 800, the type-II switching transistor 500 is the aforementioned metal oxide transistor. That is, in the first pixel circuit 800, both of the type-I switching transistor 400 and the type-II switching transistor 500 are the abovementioned metal oxide transistors.

Since the metal oxide transistor has a higher transmittance, each of the first pixel circuits 800 in the optical component arrangement zone 700 is formed of metal oxide transistors, which can improve the light transmission performance of the optical component arrangement zone 700 to cause more ambient light to emit into the optical components, thereby further improving the imaging accuracy of the display panel.

In addition, it should be noted that, referring to FIG. 18, when the first pixel circuit 800 is formed of metal oxide transistors, the gate electrode of the first transistor M1 and the gate electrode of the second transistor M2 may be electrically connected to the same first scan signal line Scant, and the gate electrode of the third transistor M3 and the gate electrode of the fourth transistor M4 can be electrically connected to the same third scan signal line Scan3, such that the number of scan signal lines penetrating the optical component arrangement zone 700 are reduced, further reducing the light transmission performance of the optical component arrangement zone 700.

Figure 19:
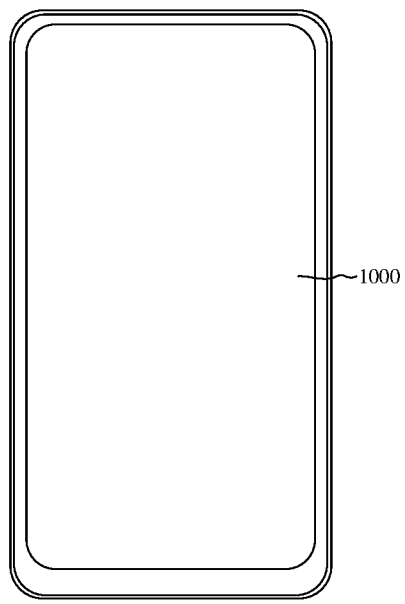
FIG. 19 is a structural schematic view showing a display apparatus according to an embodiment of the present disclosure.

Based on the same inventive concept, the present disclosure further provides a display apparatus. FIG. 19 is a schematic view showing a display apparatus according to an embodiment of the present disclosure. As shown in FIG. 19, the display apparatus includes the display panel 1000. The specific structure of the display panel 1000 has been described in detail in the above embodiments, and will not be elaborated herein. It is appreciated that the display apparatus shown in FIG. 19 is only for schematic illustration, and the display apparatus can be any electronic device having a display function, such as a mobile phone, a tablet computer, a laptop computer, an electronic paper book, a television, a smart watch, and the like.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. A metal oxide transistor, comprising a first gate electrode, an active layer, a second gate electrode, and a source-drain electrode that are stacked,
wherein the source-drain electrode comprises a source electrode and a drain electrode;
wherein the active layer comprises a plurality of active sub-layers, each of the plurality of active sub-layers comprises a metal oxide and defines a semiconductor zone;
wherein the plurality of active sub-layers comprises a first active sub-layer, a second active sub-layer, and a third active sub-layer, the first active sub-layer being located between the second active sub-layer and the first gate electrode, and the third active sub-layer being located between the second active sub-layer and the second gate electrode; and
wherein a semiconductor zone of the first active sub-layer has an oxygen ion doping concentration $C_{O\_1}$, a semiconductor zone of the second active sub-layer has an oxygen ion doping concentration $C_{O\_2}$, and a semiconductor zone of the third active sub-layer has an oxygen ion doping concentration $C_{O\_3}$, where $C_{O\_1} < C_{O\_2}$, and $C_{O\_3} < C_{O\_2}$.

2. The metal oxide transistor according to claim 1, wherein the first active sub-layer, the second active sub-layer, and the third active sub-layer comprise a same metal oxide.

3. The metal oxide transistor according to claim 1, wherein each of the first active sub-layer, the second active sub-layer, and the third active sub-layer comprises an indium-gallium-zinc oxide;
wherein the semiconductor zone of the first active sub-layer has an indium ion doping concentration $C_{In\_1}$, the semiconductor zone of the second active sub-layer has an indium ion doping concentration $C_{In\_2}$, and the semiconductor zone of the third active sub-layer has an indium ion doping concentration $C_{In\_3}$, where $C_{In\_1} > C_{In\_2}$, and $C_{In\_3} > C_{In\_2}$; and/or
wherein the semiconductor zone of the first active sub-layer has a gallium ion doping concentration $C_{Ga\_1}$, the semiconductor zone of the second active sub-layer has a gallium ion doping concentration $C_{Ga\_2}$, and the semiconductor zone of the third active sub-layer has a gallium ion doping concentration $C_{Ga\_3}$, where $C_{Ga\_1} < C_{Ga\_2}$, and $C_{Ga\_3} < C_{Ga\_2}$.

4. The metal oxide transistor according to claim 1, wherein $C_{O\_1} = C_{O\_3}$.

5. The metal oxide transistor according to claim 1, wherein the semiconductor zone of the active sub-layer comprises a first semiconductor zone, a second semiconductor zone, and a third semiconductor zone located between the first semiconductor zone and the second semiconductor zone; and
wherein the first semiconductor zone has an oxygen ion doping concentration lower than an oxygen ion doping concentration of the third semiconductor zone, or the third semiconductor zone has an oxygen ion doping concentration lower than an oxygen ion doping concentration of the second semiconductor zone.

6. The metal oxide transistor according to claim 1, wherein a direction along which the first gate electrode, the active layer, the second gate electrode, and the source-drain electrode are stacked is defined as a first direction; and
wherein the first active sub-layer has a thickness d1 in the first direction, the second active sub-layer has a thickness d2 in the first direction, and the third active sub-layer has a thickness d3 in the first direction, where d2>d1, and d2>d3.

7. The metal oxide transistor according to claim 1, wherein the metal oxide transistor further comprises a first insulating layer located between the first active sub-layer and the first gate electrode, and a second insulating layer located between the third active sub-layer and the second gate electrode;
   wherein the plurality of active sub-layers further comprises a fourth active sub-layer located between the first active sub-layer and the first insulating layer, and/or a fifth active sub-layer located between the third active sub-layer and the second insulating layer;
   wherein the fourth active sub-layer and the first active sub-layer comprise a same metal oxide, and a semiconductor zone of the fourth active sub-layer has an oxygen ion doping concentration $C_{O\_4}$, where $C_{O\_4}>C_{O\_1}$; and
   wherein the fifth active sub-layer and the third active sub-layer comprise a same metal oxide, and a semiconductor zone of the fifth active sub-layer has an oxygen ion doping concentration $C_{O\_5}$, where $C_{O\_5}>C_{O\_3}$.

8. The metal oxide transistor according to claim 7, wherein $C_{O\_4}>C_{O\_2}$ and $C_{O\_5}>C_{O\_2}$.

9. The metal oxide transistor according to claim 7, wherein $C_{O\_4}=C_{O\_5}$.

10. The metal oxide transistor according to claim 7, wherein each of the first active sub-layer, the third active sub-layer, the fourth active sub-layer, and the fifth active sub-layer comprises an indium-gallium-zinc oxide;
    wherein the semiconductor zone of the first active sub-layer has an indium ion doping concentration $C_{In\_1}$, the semiconductor zone of the fourth active sub-layer has an indium ion doping concentration $C_{In\_4}$, the semiconductor zone of the third active sub-layer has an indium ion doping concentration $C_{In\_3}$, and the semiconductor zone of the fifth active sub-layer has an indium ion doping concentration $C_{In\_5}$, where $C_{In\_4}<C_{In\_1}$, and $C_{In\_3}<C_{In\_5}$; and/or
    wherein the semiconductor zone of the first active sub-layer has a gallium ion doping concentration $C_{Ga\_1}$, the semiconductor zone of the fourth active sub-layer has a gallium ion doping concentration $C_{Ga\_4}$, the semiconductor zone of the third active sub-layer has a gallium ion doping concentration $C_{Ga\_3}$, and the semiconductor zone of the fifth active sub-layer has a gallium ion doping concentration $C_{Ga\_5}$, where $C_{Ga\_4}>C_{Ga\_1}$, and $C_{Ga\_5}>C_{Ga\_3}$.

11. The metal oxide transistor according to claim 7, wherein a direction along which the first gate electrode, the active layer, the second gate electrode, and the source-drain electrode are stacked is defined as a first direction;
    wherein the first active sub-layer has a thickness d1 in the first direction, and the fourth active sub-layer has a thickness d4 in the first direction, where d4<d1; and
    wherein the third active sub-layer has a thickness d3 in the first direction, and the fifth active sub-layer has a thickness d5 in the first direction, where d5<d3.

12. The metal oxide transistor according to claim 7, wherein a direction along which the first gate electrode, the active layer, the second gate electrode, and the source-drain electrode are stacked is defined as a first direction; and
    wherein the fourth active sub-layer has a thickness d4 in the first direction, and the fifth active sub-layer has a thickness d5 in the first direction is d5, where d4≤5 nm, and d5≤5 nm.

13. The metal oxide transistor according to claim 1, wherein the second gate electrode comprises a main gate electrode portion and an auxiliary gate electrode portion located at a side of the main gate electrode portion facing the active layer.

14. The metal oxide transistor according to claim 1, wherein the active sub-layer further comprises a first conductive zone and a second conductive zone, the source electrode is electrically connected to the first conductive zone, and the drain electrode is electrically connected to the second conductive zone.

15. A display panel, comprising:
    a substrate; and
    a plurality of pixel circuits located at a side of the substrate, wherein each of the plurality of pixel circuits comprises a metal oxide transistor comprising a first gate electrode, an active layer, a second gate electrode, and a source-drain electrode that are stacked,
    wherein the source-drain electrode comprises a source electrode and a drain electrode;
    wherein the active layer comprises a plurality of active sub-layers, and wherein each of the plurality of active sub-layers comprises a metal oxide and defines a semiconductor zone;
    wherein the plurality of active sub-layers comprises a first active sub-layer, a second active sub-layer, and a third active sub-layer, the first active sub-layer being located between the second active sub-layer and the first gate electrode, and the third active sub-layer being located between the second active sub-layer and the second gate electrode; and
    wherein a semiconductor zone of the first active sub-layer has an oxygen ion doping concentration $C_{O\_1}$, a semiconductor zone of the second active sub-layer has an oxygen ion doping concentration $C_{O\_2}$, and a semiconductor zone of the third active sub-layer has an oxygen ion doping concentration $C_{O\_3}$, where $C_{O\_1}<C_{O\_2}$, and $C_{O\_3}<C_{O\_2}$.

16. The display panel according to claim 15, wherein each of the plurality of pixel circuits comprises a driving transistor and a type-I switching transistor, wherein a source electrode or a drain electrode of the type-I switching transistor is directly connected to a gate electrode of the driving transistor, and wherein the type-I switching transistor is the metal oxide transistor.

17. The display panel according to claim 16, wherein each of the plurality of pixel circuits further comprises a type-II switching transistor, wherein a source electrode and a drain electrode of the type-II switching transistor are not directly connected to the gate electrode of the driving transistor; and
    wherein the display panel further has a display zone comprising an optical component arrangement zone, one of the plurality of pixel circuits located in the optical component arrangement zone is a first pixel circuit, and in the first pixel circuit, the type-II switching transistor is the metal oxide transistor.

18. A display apparatus comprising a display panel, wherein the display panel comprises a substrate and a plurality of pixel circuits located at a side of the substrate,
    wherein each of the plurality of pixel circuits comprises a metal oxide transistor comprising a first gate electrode, an active layer, a second gate electrode, and a source-drain electrode that are stacked, wherein the source-drain electrode comprises a source electrode and a drain electrode;

wherein the active layer comprises a plurality of active sub-layers, wherein each of the plurality of active sub-layers comprises a metal oxide and defines a semiconductor zone;

wherein the plurality of active sub-layers comprises a first active sub-layer, a second active sub-layer, and a third active sub-layer, the first active sub-layer being located between the second active sub-layer and the first gate electrode, and the third active sub-layer being located between the second active sub-layer and the second gate electrode; and wherein a semiconductor zone of the first active sub-layer has an oxygen ion doping concentration $C_{O\_1}$, a semiconductor zone of the second active sub-layer has an oxygen ion doping concentration $C_{O\_2}$, and a semiconductor zone of the third active sub-layer has an oxygen ion doping concentration $C_{O\_3}$, where $C_{O\_1} < C_{O\_2}$, and $C_{O\_3} < C_{O\_2}$.

* * * * *